US012348175B2

(12) United States Patent
Cabrera Garcia-Doncel et al.

(10) Patent No.: US 12,348,175 B2
(45) Date of Patent: Jul. 1, 2025

(54) PHOTOVOLTAIC TILE INTENDED TO BE INSTALLED ON PASSABLE EXTERIOR PAVING SURFACES

(71) Applicant: SOLUM PHOTOVOLTAIC INNOVATION, S.L., Seville (ES)

(72) Inventors: Antonio Cabrera Garcia-Doncel, Seville (ES); Luis Eduardo Muñoz Lombardo, Seville (ES); Carlos Rodriguez Osorio, Seville (ES)

(73) Assignee: SOLUM PHOTOVOLTAIC INNOVATION, S.L., Seville (ES)

( * ) Notice: Subject to any disclaimer, the term of this patent is extended or adjusted under 35 U.S.C. 154(b) by 0 days.

(21) Appl. No.: 18/033,501

(22) PCT Filed: Sep. 15, 2021

(86) PCT No.: PCT/ES2021/070661
§ 371 (c)(1),
(2) Date: Apr. 24, 2023

(87) PCT Pub. No.: WO2022/084563
PCT Pub. Date: Apr. 28, 2022

(65) Prior Publication Data
US 2024/0339954 A1    Oct. 10, 2024

(30) Foreign Application Priority Data
Oct. 22, 2020 (ES) .............................. ES202031061

(51) Int. Cl.
*H02S 20/21*    (2014.01)
*E01C 5/22*    (2006.01)
(Continued)

(52) U.S. Cl.
CPC ............... *H02S 20/21* (2014.12); *E01C 5/22* (2013.01); *E01C 11/00* (2013.01); *E01C 15/00* (2013.01);
(Continued)

(58) Field of Classification Search
CPC . H02S 20/21; H02S 20/30; E01C 5/22; E01C 11/00; E01C 15/00; H01L 31/0481
See application file for complete search history.

(56) References Cited

U.S. PATENT DOCUMENTS 8,382,393 B1 *    2/2013    Phillips .................. E01C 9/086
404/34
10,826,426 B1 *    11/2020    Tyler ...................... H02S 30/10
(Continued)

FOREIGN PATENT DOCUMENTS

CN    107419636 A    * 12/2017    ............... E01C 7/32
CN    107749732 A    *  3/2018    ......... H01L 31/0481
(Continued)

OTHER PUBLICATIONS

CN-107419636-A, Machine Translation (Year: 2017).*
CN-107749732-A, Machine Translation (Year: 2018).*
CN-209958168-U, Machine Translation (Year: 2020).*

*Primary Examiner* — Devina Pillay
(74) *Attorney, Agent, or Firm* — Hayes Soloway PC

(57) ABSTRACT

A photovoltaic tile intended to be installed on walkable exterior pavements, includes a photovoltaic laminate arranged on a matrix base. The photovoltaic laminate includes a plurality of photovoltaic cells. The photovoltaic tile further includes an upper stratum having, at least, a first layer of a laminated polymer material on the photovoltaic laminate. The first layer includes a coating of resin with additives of mixed hollow glass microspheres and with an additive of powder particles, thus enabling the necessary mechanical and slipping resistance of the photovoltaic tile (Continued)

for walkable pavements and further enabling it to be installed on the existing pavement in such a way that installation times and costs are reduced.

12 Claims, 4 Drawing Sheets

(51) Int. Cl.
    *E01C 11/00* (2006.01)
    *E01C 15/00* (2006.01)
    *H01L 31/048* (2014.01)
    *H02S 20/30* (2014.01)

(52) U.S. Cl.
    CPC .......... *H01L 31/0481* (2013.01); *H02S 20/30* (2014.12)

(56) References Cited

U.S. PATENT DOCUMENTS

| | | |
|---|---|---|
| 2005/0199282 A1 | 9/2005 | Oleinick et al. |
| 2011/0030761 A1* | 2/2011 | Kalkanoglu ............ H02S 20/23 29/897.3 |
| 2012/0255541 A1* | 10/2012 | Hendrickson ........... F24S 10/30 126/623 |
| 2012/0279559 A1* | 11/2012 | Stollwerck ............ H01L 31/049 438/73 |
| 2020/0028011 A1* | 1/2020 | Lin ..................... H01L 31/0481 |
| 2020/0204105 A1 | 6/2020 | Wang et al. |

FOREIGN PATENT DOCUMENTS

| | | |
|---|---|---|
| CN | 209958168 U * | 1/2020 |
| FR | 3002083 A1 | 8/2014 |
| WO | 02101839 A1 | 12/2002 |
| WO | 2013186412 A1 | 12/2013 |

* cited by examiner

A-A

B-B

PHOTOVOLTAIC TILE INTENDED TO BE INSTALLED ON PASSABLE EXTERIOR PAVING SURFACES

CROSS-REFERENCE TO RELATED APPLICATIONS AND PRIORITY

This patent application claims priority from PCT Application No. PCT/ES2021/070661 filed Sep. 15, 2021 which claims priority from Spanish Patent Application No. P202031061 filed Oct. 22, 2020.

OBJECT OF THE INVENTION

The present invention relates to a photovoltaic tile intended to be installed on exterior walkable pavements that falls within the field of photovoltaic pavement design. More particularly, the present invention describes a photovoltaic tile comprising an upper stratum of laminated polymer material on the photovoltaic element provided with a layer of resin, preferably made of two-component polyurethane, with additives of hollow glass microspheres and an additive of powder particles that have a lesser impact on the efficiency of photovoltaic generation than other solutions and simultaneously achieve adequate mechanical resistance and also the necessary slipping resistance for walkable pavements, wherein the photovoltaic tile is configured to be installed on the existing pavement in such a way that it also enables installation times and costs to be reduced.

BACKGROUND OF THE INVENTION

Photovoltaic pavement is a concept the development of which has been previously attempted in the state of the art.

For example, the object of documents WO 02/101839 and WO 2013/186412 are walkable pavements made up of photovoltaic components of some kind.

The prior art known in the state of the art aims to achieve an effective encapsulation of the photovoltaic modules or directly walkable pavements made up of photovoltaic components.

However, known documents prioritise anti-slipping and mechanical strength over energy efficiency. In order to achieve the desired slipping resistance, they seek to use a macro texture in the upper layer, which considerably impacts the performance of the photovoltaic components, since it hinders the absorption of solar radiation by the photovoltaic cells. Furthermore, the known documents entail a sump that facilitates the deposition of dirt, which is a pressing problem in this application since it increases maintenance work and costs for cleaning.

In addition, some photovoltaic pavements use a special thicker glass to achieve adequate impact resistance for use as pavement, incurring significant costs.

Likewise, in the known state of the art, crushed glass fragments are used in the upper layer of the tiles or pavements to provide greater roughness or alternatively recessed reliefs on the upper face, considerably increasing reflectivity and consequently reducing energy production. Furthermore, these known designs, especially through the use of reliefs, favour the accumulation of dirt and particles that reduce photovoltaic production.

Also, designs that increase the thickness of the upper glass deviate from commercial designs and are not suitable for use with commercial photovoltaic modules and/or laminates. As a result, manufacturing this type of model implies the need to enable an own production line, which prevents benefiting from the scale economy resulting from the mass manufacture of photovoltaic modules, incurring additional costs that are difficult to assume in order to be competitive.

All known background needs to manufacture a photovoltaic laminate with special features for the intended purpose, in this case photovoltaic pavements with particular designs, not being able to use commercial photovoltaic laminates.

DESCRIPTION OF THE INVENTION

The present invention intends to solve some of the problems mentioned in the state of the art. More particularly, the present invention describes a photovoltaic tile intended to be installed on exterior walkable pavements, comprising:
- a photovoltaic laminate arranged on a matrix base, wherein said photovoltaic laminate comprises a plurality of photovoltaic cells.
- and wherein said photovoltaic tile further comprises an upper stratum comprising, at least, a first layer of a laminated polymer material on the photovoltaic laminate, wherein said first layer in turn comprises a coating of resin with additives of mixed hollow glass microspheres and with an additive of powder particles.

The upper stratum can be equipped with a single first layer or it can comprise a combination of layers that includes different types of polymers, depending on the properties of each of them that are to be incorporated.

Advantageously, the upper layer of polymer material comprises high-transparency thermoplastic polyurethane.

In addition, the upper stratum can comprise an additional material that has a structural matrix that serves as a filter against infrared radiation. In a preferred embodiment, this additional material comprises a thermoplastic polyurethane film.

Preferably, the upper stratum comprises a coating that in turn comprises a mixture of polyurethane resin with additive of hollow glass microspheres (HGM) in a percentage of 0.05% to 10% by weight with respect to the majority component of two-component resin mixed with an additive that provides roughness to the surface, such as, for example, a transparent high-density polyethylene powder or a polyamide additive thicker than the first in a percentage of 0.1% to 10% by weight with respect to the majority component of two-component resin.

Preferably, the additive of hollow microspheres (HGM) comprises a percentage of 0.1 to 2% by weight with respect to the resin. More preferably 0.5% to 1%.

Likewise, the additive of powder particles may comprise a percentage of 1% to 10% by weight with respect to the resin. Preferably 2% to 6% and preferably 3% to 5%.

The resin coating of the first layer can be a two-component resin with additives of mixed hollow glass microspheres and with an additive of powder particles, in any of the aforementioned ranges for each of said additives.

Advantageously, the upper stratum further comprises a sealing layer of polyurethane-based two-component resin the objective of which is to protect against abrasive loads on the hollow glass microspheres that make up a first layer of the coating.

The tile described above protects against loads and impacts on exterior walkable pavements. Note that, in a conventional solar panel, the impacts are absorbed by the light collection and transmission medium itself, for example, a 3.2 mm ultra-clear tempered glass. This thickness is insufficient to adapt photovoltaic technology to the conditions of use of the pavement.

In the manner described above, in particular with the upper stratum treated with the described coating, the necessary protection is achieved without the need to increase the thickness of the tempered glass.

Likewise, the upper stratum described makes it possible to achieve the necessary grip of the pedestrian by means of the appropriate roughness, thus guaranteeing safety against slipping. Specifically, the upper stratum with the corresponding coating described achieves the degree of anti-slipping that guarantees pedestrian safety in both wet and dry conditions.

Additionally, the tempered glass conventionally installed in photovoltaic panels favours the accumulation of dust and other residues, especially if they are installed in a horizontal plane, causing production losses due to fouling. This has been solved with the technical features described above.

The upper stratum of laminated polymer material on the photovoltaic laminate, which comprises a resin coating preferably of two-component polyurethane with an additive of mixed hollow glass microspheres and with an additive of powder particles, such as for example those mentioned above, makes it possible to prevent production losses due to fouling since it does not have reliefs on the upper face thereof, like other solutions in the state of the art, such as, for example, fragments of crushed glass. These properties also enable easier cleaning, and consequently simplify maintenance work.

Likewise, the coating described also has a lower reflectivity index than other known solutions, thus increasing the percentage of solar radiation that reaches the photovoltaic panel.

The preferred embodiment that comprises the sealing layer of resin, for example, made of polyurethane-based two-component, together with a first layer that also comprises hollow glass microspheres, equips the photovoltaic tile with hydrophobic properties on the surface thereof. More particularly, it exerts a surface tension on the water that comes into contact with the surface, repelling it. This prevents the accumulation of liquids on said surface and facilitates its cleaning by the effect of gravity.

Hollow glass microspheres have a lower thermal conductivity than glass, therefore, they reduce the transmission of heat from cells to the outside, thus preventing the surface from being at a high temperature that could damage a pedestrian.

Likewise, in a preferred embodiment, one of the polymer layers comprises infrared radiation reflective properties, preventing the photovoltaic cells from overheating unnecessarily.

Advantageously, the photovoltaic element is a commercial photovoltaic laminate for electricity generation widely known and used in the state of the art, such as, for example, a commercial photovoltaic laminate comprising a circuit of photovoltaic cells packed in EVA between a sheet made of polyvinyl fluoride (PVF) and another made of tempered glass (3.2 mm thick), in this case without anti-reflective treatment.

As a consequence, the photovoltaic tile described by the present invention does not require a special design of photovoltaic modules, and enables commercial photovoltaic laminates to be housed. This significantly reduces manufacturing costs.

More particularly, the matrix base and the described components of the photovoltaic tile allow any type of cell on the market to be housed, such as rigid, flexible, monocrystalline silicon, polycrystalline silicon, cadmium tellurium cells, high efficiency cells, etc.

Advantageously, the perimeter frame of the matrix base comprises a plurality of through perimeter holes to the outside intended to house the interconnection wiring.

The matrix base serves as an exit point for the interconnection wiring between generation units and the ground gripping elements.

An inner space or chamber can be arranged between the matrix base and the photovoltaic laminate, wherein said inner chamber or space is provided with a filling. Said filling can comprise polyurethane foam and/or marble gravel to increase the thermal transmission from the photovoltaic cells to the outside.

The connection of the support structure and the polyurethane foam filling in a preferred embodiment provide the tightness and insulation necessary to guarantee electrical safety to the photovoltaic tile.

The inner chamber can have different configurations. For example, in a preferred embodiment, the matrix base comprises a perimeter frame and a plurality of ribs that define through grooves. The space that makes up said configuration between the photovoltaic laminate and the space defined below to the ground is defined as the inner chamber or space that comprises the aforementioned filling.

In another preferred embodiment, the matrix base comprises a plurality of convex sections, which could be attached directly to the ground without the need for the lower part.

Photovoltaic cells are 200 μm thick silicon sheets, which is why they are highly fragile. It is therefore essential to avoid vertical movements that produce micro-cracks that degenerate into irreversible efficiency losses. The proposed support structure with said photovoltaic cells arranged on the proposed matrix base fulfils said task for any load produced by pedestrians.

Advantageously, the lower part is attached to the ground by means of an anchoring mechanism provided with a plurality of plates screwed to the ground.

In addition, said anchoring mechanism can be provided with rails equipped with threaded cylinders adapted to coincide with holes in the lower part and the upper frame configured in such a way in order to attach said lower part to the upper frame by means of attachment means that said threaded cylinders penetrate.

DESCRIPTION OF THE DRAWINGS

As a complement to the present description, and for the purpose of helping to make the features of the invention more readily understandable, in accordance with a preferred practical exemplary embodiment thereof, said description is accompanied by a set of drawings constituting an integral part of the same, which by way of illustration and not limitation represent the following.

PREFERRED EMBODIMENT OF THE INVENTION

Next, a preferred embodiment of the photovoltaic tile (1) intended to be installed on exterior walkable pavements is described with the aid of FIGS. 1-4.

Figure 1:
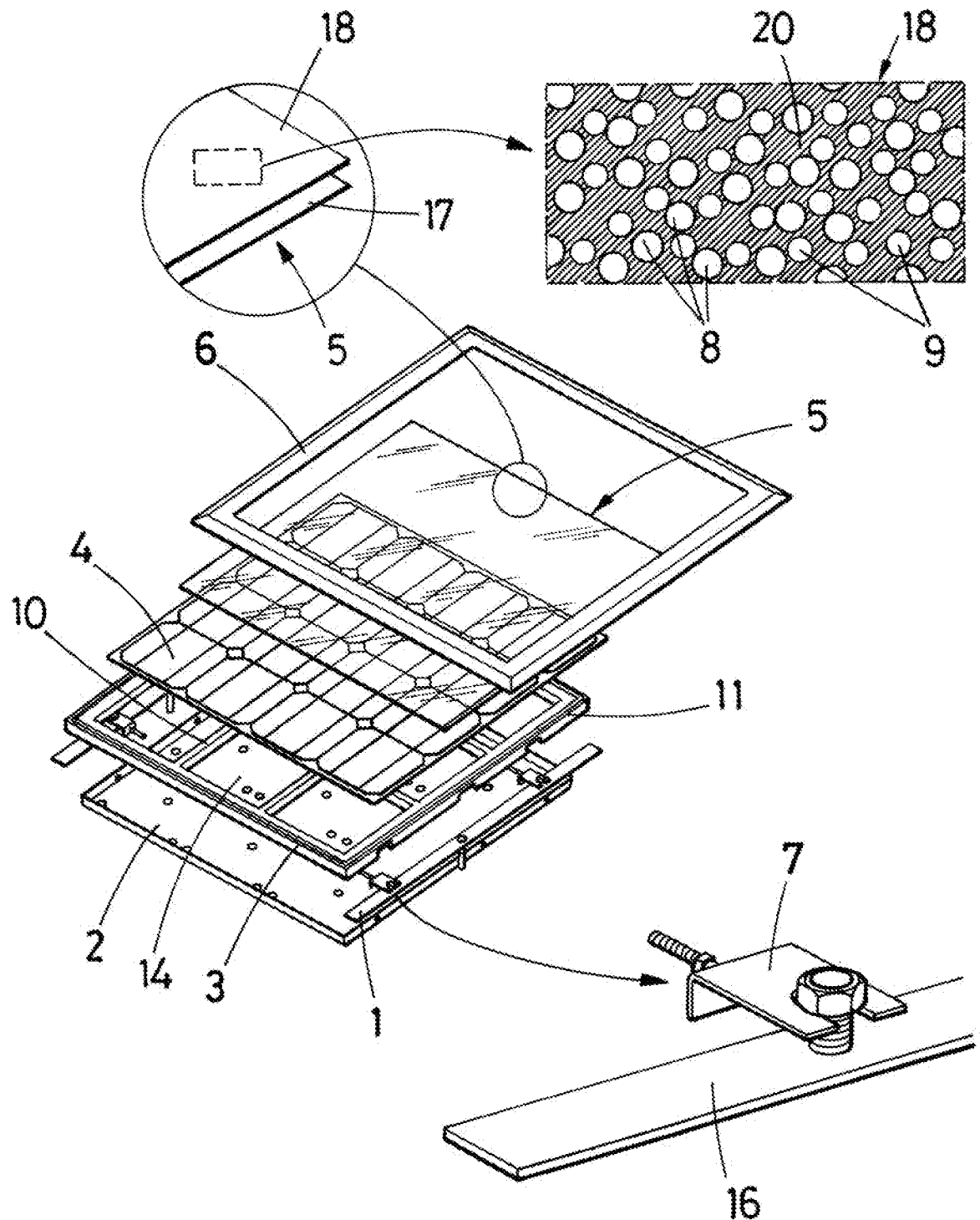
FIG. 1 shows an exploded perspective view of the preferred embodiment of the photovoltaic tile showing the upper frame, the matrix base, the lower part and the upper stratum that comprises a thermoplastic polyurethane film with the coating of polyurethane resin with an additive of hollow glass microspheres and an additive of powder particles.

FIG. 1 shows an exploded view of the photovoltaic tile (1) showing that it comprises a lower part (2) attached to the ground and embedded in a matrix base (3), wherein said matrix base (3) comprises a perimeter frame (11) and a plurality of ribs (10) that define grooves (14).

Figure 3:
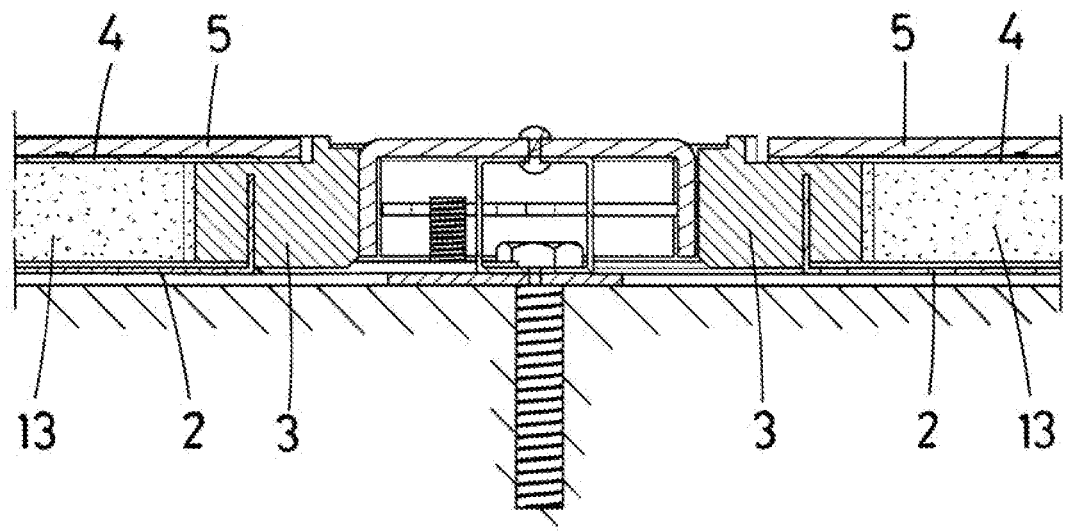
FIG. 3 shows a view of cross section A-A of FIG. 2, showing the filling, the photovoltaic laminate, the matrix base and the perimeter ramp.
Figure 4:
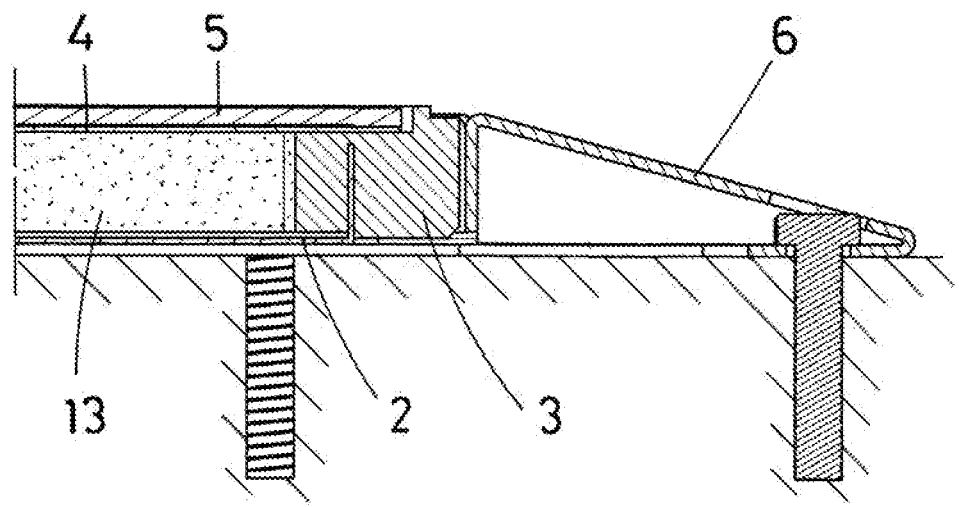
FIG. 4 shows a view of the cross section B-B of FIG. 2, showing the filling, the photovoltaic laminate, the matrix base and the intermediate flashing.

A photovoltaic laminate (4) is placed on said matrix base (3) defining a lower chamber that comprises a filling (13) as seen in FIG. 3 and FIG. 4.

In the preferred embodiment described, said filling (13) comprises polyurethane foam and/or marble gravel to increase the thermal transmission from the photovoltaic cells to the outside.

Likewise, FIG. 1 shows a laminated upper stratum (5) laminated on the photovoltaic laminate (4) which in the described preferred embodiment comprises a first layer (17) of a thermoplastic polyurethane film, which is subsequently covered with a coating (18) comprising a two-component polyurethane resin (20).

The first layer (17) of thermoplastic polyurethane film comprises in turn a coating (18) of two-component polyurethane resin (20) with hollow glass microspheres (9) mixed with an additive of powder particles (8) that in a preferred embodiment consists of transparent high-density polyethylene powder that is thicker than the hollow glass spheres (9).

In the preferred embodiment, the upper stratum (5) comprises a polymeric material with infrared radiation reflective properties in one of its layers so as not to heat the photovoltaic laminate (4) unnecessarily.

Likewise, FIG. 1 shows an upper frame (6) rigidly attached to the lower part (2) by means of an anchoring system (7) which in turn comprises rails equipped with threaded cylinders adapted to coincide with holes in the lower part (2) and in the upper frame (6) configured to attach said lower part (2) to the upper frame (6).

As shown in FIG. 1, the lower part (2) is attached to the ground by means of plates that are rigidly coupled to said lower part (2) and screwed to the ground.

Figure 2:
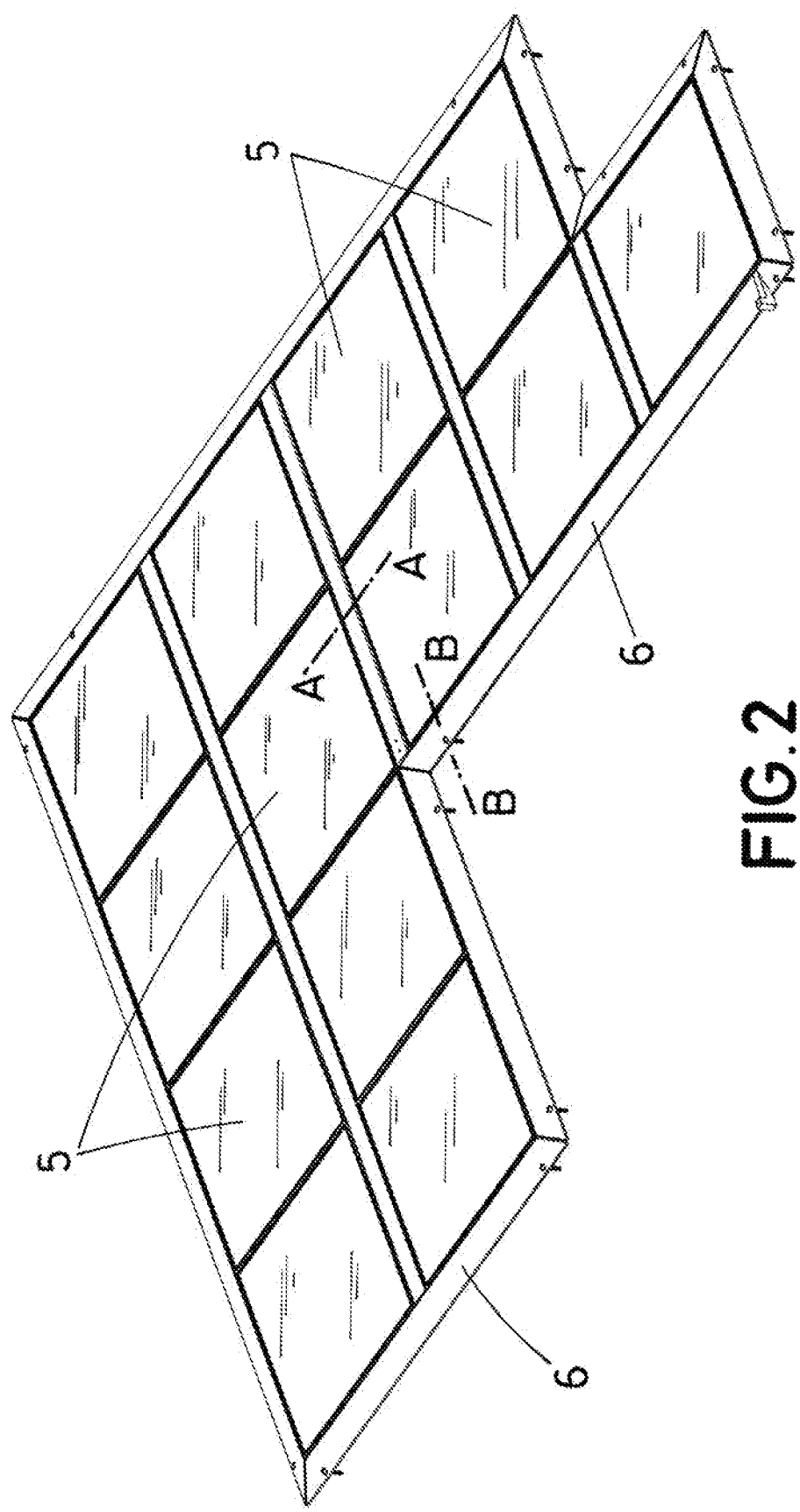
FIG. 2 shows a perspective view of a plurality of adjacent photovoltaic tiles according to the present invention, forming a walkable photovoltaic pavement.

FIG. 2 shows a perspective view of a plurality of photovoltaic tiles (1) according to the present invention, forming a walkable photovoltaic pavement with considerable photovoltaic efficiency and simultaneously with mechanical resistance and sufficient roughness for pedestrian traffic and even light vehicles.

The photovoltaic laminates (4) can be of the commercial type and dimensioned to be housed in the photovoltaic tiles (1) described above and connected in series/parallel depending on the surface of the walkable exterior pavement and the needs of the installation.

FIG. 3 shows a view of cross section A-A of the preferred embodiment described by FIG. 2, showing that the inner chamber between the matrix base (3) and the lower part (2) is provided with a filling (13) which comprises polyurethane foam and marble gravel.

FIG. 4 shows a view of cross section B-B of the preferred embodiment described by FIG. 2.

Figure 5:
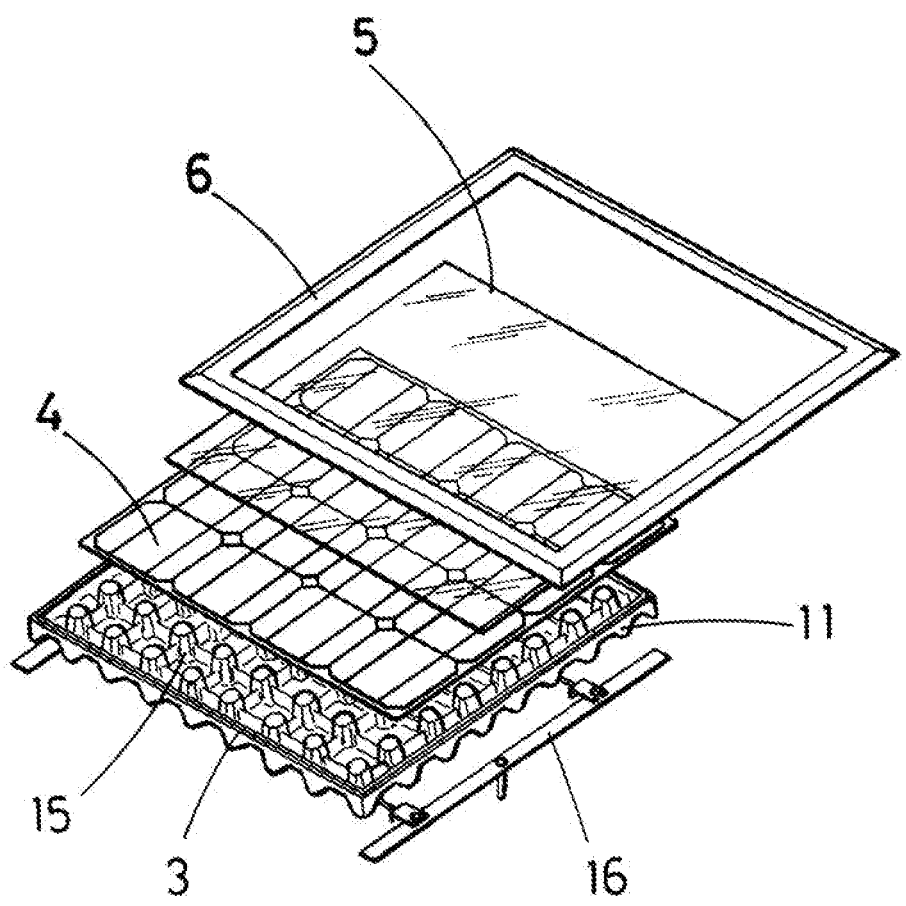
FIG. 5 shows a perspective view of a second preferred embodiment, wherein the matrix base comprises a plurality of convex sections and wherein said matrix base is attached to the ground.

FIG. 5 shows an alternative embodiment that does not have the lower part (2) and wherein the matrix base (3) is directly attached to the ground.

More in particular, the preferred embodiment of FIG. 5 comprises a matrix base (3) with a configuration without through grooves and alternatively comprises a configuration equipped with a plurality of convex sections (15).

The invention claimed is:

1. A photovoltaic tile intended to be installed on walkable exterior pavements, comprising:
    a photovoltaic laminate arranged on a matrix base, wherein said photovoltaic laminate comprises a plurality of photovoltaic cells,
    an upper stratum comprising at least a first layer of a laminated polymeric material on the photovoltaic laminate, wherein said first layer in turn comprises a coating of resin with additives of mixed hollow glass microspheres and with an additive of powder particles, wherein the additive of powder particles has a percentage of 1-10% by weight with respect to the resin and/or the additive of hollow glass microspheres has a percentage of 0.1-2% by weight with respect to the resin, and
    an inner chamber provided with a space defined between the matrix base and the photovoltaic laminate, wherein said inner chamber comprises a filling, the filling comprises:
    marbled gravel to increase heat transmission from the photovoltaic cells to the outside; and
    polyurethane foam.

2. The photovoltaic tile of claim 1, wherein the polymer material is a high-transparency thermoplastic polyurethane resin.

3. The photovoltaic tile of claim 1, wherein the additive of powder particles comprises transparent high-density polyethylene powder.

4. The photovoltaic tile of claim 1, wherein the additive of powder particles is a polyamide additive.

5. The photovoltaic tile of claim 1, wherein the upper stratum comprises a sealing layer provided with a two-component polyurethane-based resin.

6. The photovoltaic tile of claim 1, wherein the upper stratum comprises a polymeric material with infrared radiation reflective properties in at least one layer.

7. The photovoltaic tile of claim 1, wherein the matrix base comprises a perimeter frame and a plurality of ribs that define through grooves.

8. The photovoltaic tile of claim 1, further comprising a lower part attached to the ground and wherein the matrix base is embedded in said lower part.

9. The photovoltaic tile of claim 1, wherein the matrix base comprises a perimeter frame and a plurality of convex sections.

10. The photovoltaic tile of claim 9, wherein the matrix base is rigidly attached to the ground.

11. The photovoltaic tile of claim 1, wherein the matrix base comprises a perimeter frame and a plurality of through perimeter holes to the outside intended to house the interconnection wiring.

12. The photovoltaic tile according to claim 1, which comprises:

an anchoring mechanism which in turn comprises rails equipped with threaded cylinders adapted to coincide with holes in a lower part which is anchored to the ground, and an upper frame configured to attach the lower part to said upper frame.

\* \* \* \* \*